(12) United States Patent
Gao et al.

(10) Patent No.: US 11,411,204 B2
(45) Date of Patent: Aug. 9, 2022

(54) DISPLAY PANEL, ELECTRONIC DEVICE, AND METHOD OF FABRICATING THEREOF

(71) Applicant: WUHAN CHINA STAR OPTOELECTRONICS SEMICONDUCTOR DISPLAY TECHNOLOGY CO., LTD., Hubei (CN)

(72) Inventors: Hong Gao, Hubei (CN); Mugyeom Kim, Hubei (CN); Yong Zhao, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 373 days.

(21) Appl. No.: 16/613,318

(22) PCT Filed: Jul. 3, 2019

(86) PCT No.: PCT/CN2019/094466
§ 371 (c)(1),
(2) Date: Nov. 13, 2019

(87) PCT Pub. No.: WO2020/134007
PCT Pub. Date: Jul. 2, 2020

(65) Prior Publication Data
US 2021/0343988 A1    Nov. 4, 2021

(30) Foreign Application Priority Data
Dec. 29, 2018  (CN) .......................... 201811639086.7

(51) Int. Cl.
H01L 27/32 (2006.01)
H01L 51/52 (2006.01)
H01L 51/56 (2006.01)

(52) U.S. Cl.
CPC ........ *H01L 51/5265* (2013.01); *H01L 27/326* (2013.01); *H01L 27/3234* (2013.01);
(Continued)

(58) Field of Classification Search
CPC ....................... H01L 51/5265; H01L 27/3234
See application file for complete search history.

(56) References Cited

U.S. PATENT DOCUMENTS 10,056,439 B2   8/2018  Chung
2002/0000561 A1  1/2002  Yamagata et al.
(Continued)

FOREIGN PATENT DOCUMENTS

CN    101015232 A    8/2007
CN    102487128 A    6/2012
(Continued)

*Primary Examiner* — Douglas M Menz

(57) ABSTRACT

A display panel, an electronic device and a method of fabricating thereof. The display panel is a laminated structure comprising a substrate, a thin film transistor layer on the substrate, a pixel defining layer on the thin film transistor layer, and a light emitting structure on the pixel defining layer. The light emitting structure comprises a plurality of transparent regions and a plurality of light emitting regions disposed at intervals, the transparent regions correspond to light sensors. The light emitting structure comprises a first light extraction layer disposed in the transparent region.

11 Claims, 3 Drawing Sheets

(52) U.S. Cl.
CPC .......... *H01L 27/3246* (2013.01); *H01L 51/56* (2013.01); *H01L 2227/323* (2013.01)

(56) References Cited

U.S. PATENT DOCUMENTS

| | | |
|---|---|---|
| 2003/0127656 A1 | 7/2003 | Aizawa et al. |
| 2007/0290607 A1 | 12/2007 | Okada et al. |
| 2013/0285539 A1 | 10/2013 | Kim et al. |
| 2015/0064826 A1 | 3/2015 | Jo et al. |
| 2017/0070679 A1* | 3/2017 | Chung ................. G09G 3/3275 |
| 2018/0047790 A1 | 2/2018 | Chae et al. |
| 2018/0083228 A1 | 3/2018 | Yang et al. |
| 2018/0198093 A1 | 7/2018 | Yu |
| 2018/0374904 A1 | 12/2018 | Xu |
| 2019/0259975 A1 | 8/2019 | Ltd |
| 2020/0075680 A1* | 3/2020 | Sun ........................ H01L 51/56 |
| 2020/0194538 A1* | 6/2020 | Lou ..................... H01L 27/3227 |
| 2021/0359051 A1* | 11/2021 | Jin ...................... H01L 51/0096 |

FOREIGN PATENT DOCUMENTS

| | | |
|---|---|---|
| CN | 103378124 A | 10/2013 |
| CN | 104576703 A | 4/2015 |
| CN | 106067475 A | 11/2016 |
| CN | 106654046 A | 5/2017 |
| CN | 107482126 A | 12/2017 |
| CN | 107732024 A | 2/2018 |
| CN | 207409492 U | 5/2018 |
| CN | 108615746 A | 10/2018 |

* cited by examiner

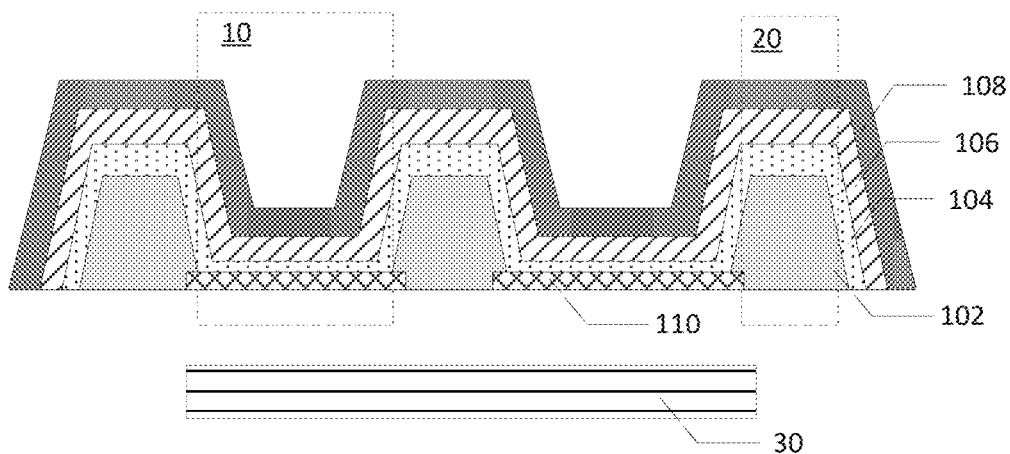
FIG. 1, Prior Art
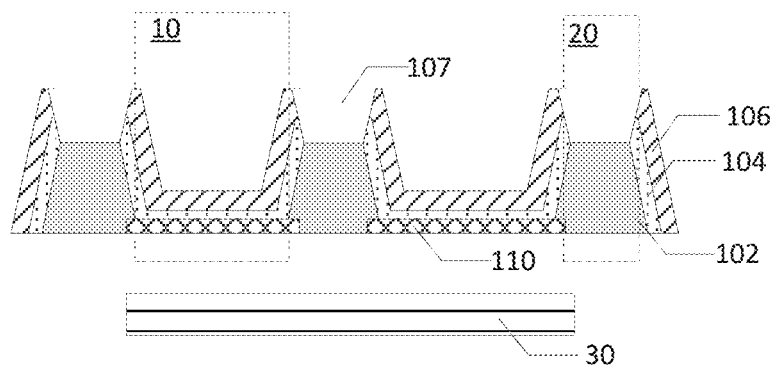
FIG. 2
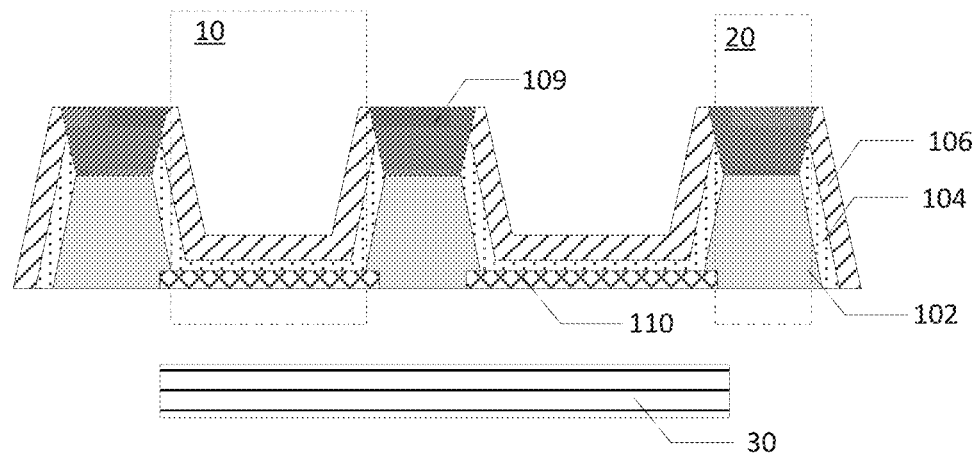
FIG. 3

DISPLAY PANEL, ELECTRONIC DEVICE, AND METHOD OF FABRICATING THEREOF

CROSS REFERENCE TO RELATED APPLICATION

This application claims the priority of International Application No. PCT/CN2019/094466, filed on 2019 Jul. 3, which claims priority to Chinese Application No. 201811639086.7, filed on 2018 Dec. 29. The entire disclosures of each of the above applications are incorporated herein by reference.

BACKGROUND OF INVENTION

Field of Invention

The present invention relates to the field of display technologies, and in particular, to a display panel, an electronic device, and a method of fabricating thereof.

Description of Prior Art

The technology of under screen cameras is a new technology proposed to break the screen ratio limit of present display screens. Its principle is to integrate a camera in a display area of a display device, so that the display area can simultaneously realize a display function and camera function, thereby realizing a real comprehensive screen.

Technical Problem

Because the under screen camera is hidden inside the display panel, light entering the camera is inevitably blocked and absorbed by encapsulation layer, electrode layer, and the like of the display panel, which increases imaging difficulty. Therefore, the transparent region needs further process to increase the light transmittance in the region and improve imaging ability.

SUMMARY OF INVENTION

The present application provides a display panel, an electronic device, and a method of fabricating thereof to improve the light transmittance of a transparent region of a display panel.

In order to solve the above problems, the present application provides a display panel, wherein the display panel is a laminated structure comprising a substrate, a thin film transistor layer on the substrate, a pixel defining layer on the thin film transistor layer, and a light emitting structure on the pixel defining layer;

wherein the light emitting structure comprises a plurality of transparent regions and a plurality of light emitting regions disposed at intervals, the transparent regions correspond to light sensors; and wherein the light emitting structure comprises a first light extraction layer disposed in the transparent region.

The display panel according to claim 1, wherein the light emitting structure comprises a cathode provided with through holes disposed in the transparent regions;

wherein the first light extraction layer corresponds to the through holes.

According to one aspect of the application, wherein the light emitting structure comprises a cathode, at least a portion of the cathode is located in the transparent regions;

wherein the first light extraction layer is disposed on a side of the cathode close to the substrate.

The display panel according to claim 3, wherein the light emitting structure further comprises a second light extraction layer disposed in the transparent regions, the second light extraction layer is disposed on a side of the cathode away from the substrate.

According to one aspect of the application, wherein the thin film transistor layer includes a plurality of transparent units corresponding to the plurality of the transparent regions, an area of a projection of the first light extraction layer on a horizontal plane is greater than or equal to an area of a projection of the transparent units in the thin film transistor layer on the horizontal plane.

According to one aspect of the application, wherein the material forming the first light extraction layer is an inorganic substance or organic small molecules.

According to one aspect of the application, wherein a material forming the second light extraction layer is an inorganic substance or organic small molecules.

According to one aspect of the application, wherein an auxiliary light emitting layer is disposed between the pixel defining layer of the transparent regions and the first light extraction layer, the auxiliary light emitting layer consists of by an extension of an auxiliary light emitting layer in the light emitting regions adjacent to the transparent regions.

According to one aspect of the application, wherein the cathode is disposed in the transparent regions and the light emitting regions.

The present application further provides an electronic device comprising a display panel and a light sensor, wherein the display panel is a laminated structure comprising a substrate, a thin film transistor layer on the substrate, a pixel defining layer on the thin film transistor layer, and a light emitting structure on the pixel defining layer;

wherein the light emitting structure comprises a plurality of transparent regions and a plurality of light emitting regions disposed at intervals, the transparent regions correspond to light sensors;

wherein the light emitting structure comprises a first light extraction layer disposed in the transparent region.

According to one aspect of the application, wherein the light sensor is disposed on a side of the substrate away from the thin film transistor layer, and the light sensor is a camera.

The present application further provides a method of fabricating a display panel, wherein the method comprises the steps of:

providing a substrate;

forming a thin film transistor layer on the substrate;

forming a pixel defining layer on the thin film transistor layer, the pixel defining layer is provided with through holes;

forming an anode at a bottom of the through holes;

forming a light emitting layer covering the pixel defining layer and the anode;

forming a cathode covering the light emitting layer;

forming a first light extraction layer on a top of the pixel definition layer.

According to one aspect of the application, wherein after forming a first light extraction layer on a top of the pixel definition layer, the method further comprises:

forming a second light extraction layer covering the first light extraction layer and the cathode.

According to one aspect of the application, wherein a method of forming a first light extraction layer a on a top of the pixel definition layer comprises:

forming through holes in a region above a top of the pixel defining layer, a depth of the through holes is less than or equal to a sum of a thicknesses of the light emitting layer and the cathode layer;

forming a first light extraction layer by depositing transparent protective material in the through holes.

According to one aspect of the application, wherein a method of forming a first light extraction layer on a top of the pixel definition layer comprises:

depositing a transparent protective material on a surface of the cathode;

removing the transparent protective material on the anode and sidewalls of the pixel defining layer and retaining the transparent material on the top of the pixel defining layer to form a first light extraction layer.

Beneficial Effects

By removing an electrode layer and a light emitting layer in the transparent region in the light emitting structure in the display panel, the present application avoids light entering the display panel and being absorbed by the electrode layer and the light emitting layer, thereby avoiding light loss and improving light transmittance of the display panel. In addition, the present application also provides a first light extraction layer in the transparent region. The first light extraction layer is made of inorganic or organic small molecules, which can change the optical structure of the device and adjust its microcavity effect, thereby improving the light extraction efficiency of the light transmission region.

BRIEF DESCRIPTION OF DRAWINGS

FIG. 1 is a partial structural diagram of a display panel integrated with a camera in the prior art.

FIG. 2 and FIG. 3 are structural diagrams of a display panel integrated with a camera in the first embodiment of the present application.

DETAILED DESCRIPTION OF PREFERRED EMBODIMENTS

Figure 4:
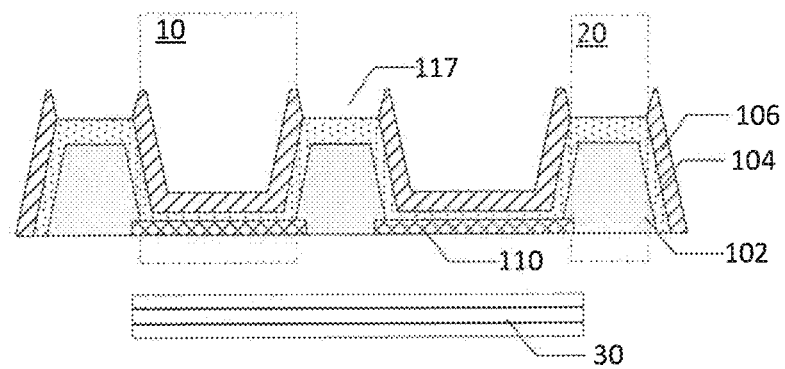
FIG. 4 and FIG. 5 are structural diagrams of a display panel integrated with a camera in a second embodiment of the present application.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

First, the prior art is briefly described. Referring to FIG. 1, FIG. 1 is a partial structural diagram of a display panel integrated with a camera in the prior art. The display panel includes a substrate, a thin film transistor layer on the substrate, a pixel defining layer 102 on the thin film transistor layer, and a light emitting structure on the pixel defining layer 102.

The pixel defining layer has a through hole penetrating the pixel defining layer. The thin film transistor layer is integrated with a photosensor array 30. The light emitting structure includes an anode 110 at a bottom of the through hole, a light emitting layer 104 covering the pixel defining layer 102 and the anode 110, a cathode 106 covering the light emitting layer 104, and a second light extraction layer 108 covering the cathode 106. Wherein the anode and a laminated structure above the anode constitute a light emitting region 10 of the display panel, the pixel defining layer 102 and the laminated structure on the pixel defining layer 102 form a transparent region 20 of the display panel.

In the prior art, although the laminated structure above the pixel defining layer 102 and the pixel defining layer 102 are transparent material, it is inevitable that light entering the display panel would be absorbed and affects the light transmittance of the display panel.

Therefore, the present application provides a display panel and a fabricating method thereof to improve the light transmittance of a transparent region of the display panel.

Preferably, the display panel is an OLED display panel. The OLED display panel has the advantages of light weight, fast response times, wide viewing angles, high contrast, flexibility etc., is an optimal choice for under screen cameras or under screen fingerprint recognition units.

The application provides a display panel with a laminated structure, which including a substrate (not shown), a thin film transistor layer (not shown) on the substrate, a pixel defining layer on the thin film transistor layer, and a light emitting structure on the pixel defining layer. The light emitting structure includes a plurality of transparent regions and light emitting regions arranged at intervals. A plurality of the transparent regions 20 are used for corresponding light sensors. The light emitting structure includes a first light extraction layer located in the transparent region.

Material of the first light extraction layer is an inorganic substance or an organic small molecule. Inorganic or organic small molecules can change the optical structure of the device and adjust its microcavity effect, thereby improving the light extraction efficiency of the transparent region. The inorganic substance can be zinc selenide (ZnSe), and the organic small molecule can be n-bromopropane (NPB) or other aromatic amine-based organic matter.

The light emitting structure includes a cathode providing with through holes disposed in the transparent regions. Wherein the first light extraction layer corresponds to the through holes. In other embodiments the light emitting structure includes a cathode, at least a portion of the cathode is located in the transparent regions. Wherein the first light extraction layer is disposed on a side of the cathode close to the substrate.

The light emitting structure further includes a second light extraction layer disposed in the transparent regions, the second light extraction layer is disposed on a side of the cathode away from the substrate. The thin film transistor layer includes a plurality of transparent units corresponding to the plurality of the transparent regions, an area of a projection of the first light extraction layer on a horizontal plane is greater than or equal to an area of a projection of the transparent units in the thin film transistor layer on the horizontal plane.

The present application will be described in detail below with reference to the accompanying drawings.

Specifically, referring to FIG. 3, FIG. 3 is a structural diagram of a display panel integrated with a camera in an embodiment of the present application. In this embodiment, the display panel includes a thin film transistor layer including a plurality of thin film transistor units and a plurality of transparent units disposed at intervals. Correspondingly, the light emitting structure includes a plurality of transparent regions 20 and a plurality of light emitting regions 10 disposed at intervals, the transparent regions being located above the transparent unit.

Specifically, in this embodiment, the light emitting structure includes an anode 110 at a bottom of the through hole, a light emitting layer 104 covering the pixel defining layer 102 and the anode 110, and a cathode 106 covering the light emitting layer 104, and a second light extraction layer 108 covering the cathode 106. Wherein the anode and the laminated structure above the anode constitute the light emitting regions 10 of the display panel, the pixel defining layer 102 and the pixel defining layer 102 and the stacked structure above form a transparent region 20 of the display panel.

In the present embodiment, because the light emitting layer 104 and the cathode 106 located above the transparent region 20 are removed, as shown in FIG. 2, the transparent region 20 includes a pixel defining layer 102 above the transparent unit and a first light extracting layer 109 above the pixel defining layer 102.

In this embodiment, material forming the first light extraction layer is an inorganic substance or an organic small molecule. The inorganic substance or the organic small molecule can change the excited state of the transparent material of the transparent region, thereby improving the light transmittance of the transparent region. At the same time, since the light emitting layer 104 and the cathode 106 located on the transparent regions 20 are removed, the present application can greatly prevent the light from being absorbed when entering the display panel, thereby effectively improving the light transmittance of the display panel.

Preferably, in this embodiment, in order to ensure that the first light extraction layer 109 covers the transparent regions 20, an area of a projection of the first light extraction layer 109 on a horizontal plane is greater than or equal to an area of a projection of the transparent unit in the thin film transistor layer on the horizontal plane.

Figure 5:
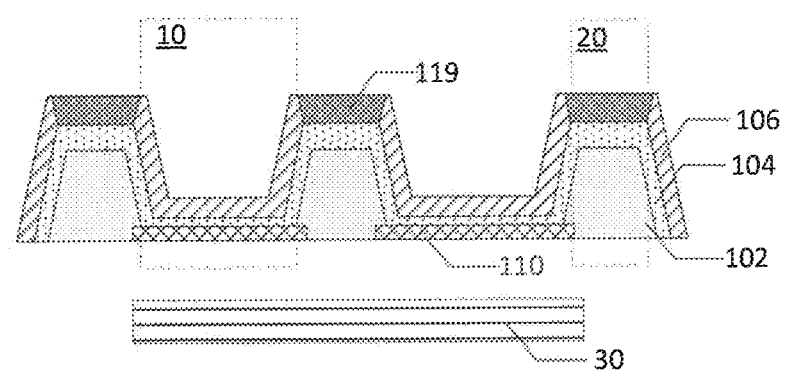

Preferably, in another embodiment of the present application, as shown in FIG. 5, an auxiliary light emitting layer 104 is disposed between the pixel defining layer 102 of the transparent regions and the first light extraction layer 119, the auxiliary light emitting layer 104 is consisted by an extension of an auxiliary light emitting layer 104 in the light emitting regions adjacent to the transparent regions 10.

Generally, the light emitting structure in the OLED display panel includes a light emitting layer between the cathode and the anode, the light emitting layer including an auxiliary light emitting layer and a light emitting material layer located intermediate the auxiliary light emitting layer. In order to save cost, the light emitting material layer is only disposed at the bottom of the through hole in the pixel defining layer, covering the anode to emit light. The auxiliary light emitting layer covers the entire pixel defining layer. In the present application, an auxiliary light emitting layer is provided between the pixel defining layer 102 and the first light extracting layer 119 of the transparent regions, and does not include a light emitting material layer.

Retaining the auxiliary light emitting layer can reduce a depth of the through hole to be etched, as shown in FIG. 4, and simplifying the composition of the material to be etched, thereby simplifying the process flow and saving cost while improving light emitting efficiency.

Figure 8:
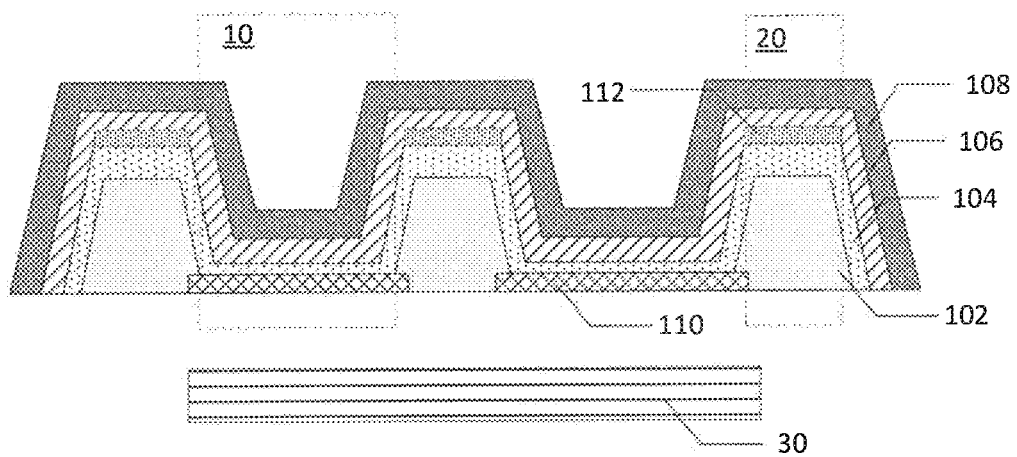

Preferably, in another embodiment of the present application, as shown in FIG. 8, an electrode layer 106 is disposed between the light emitting layer of the transparent regions 20 and the first light extracting layer 109, the electrode layer 106 is formed by an extension of the electrode layer 106 in the light emitting regions 10 adjacent to the transparent regions 20.

Retaining the light emitting layer 104 and the electrode layer 106 in the transparent regions 20 can save the process steps of removing the light emitting layer 104 and the electrode layer 106 by photolithography, thereby saving cost. Removing the light emitting layer 104 and the electrode layer 106 can further optimize the light transmittance of the display panel. In practice, a suitable structure can be selected by the need for light transmittance.

Preferably, in another embodiment of the present application, as shown in FIG. 8, the electrode layer of the transparent regions 20 further includes a second light extraction layer 108. The second light extraction layer 108 is formed by an extension of the second light extraction layer 108 in the light emitting regions 10 adjacent to the transparent regions 20. Material of the second light extraction layer 108 is the same as the first light extraction layer 109, and is an inorganic substance or an organic small molecule. The inorganic substance can be zinc selenide (ZnSe), and the organic small molecule can be n-bromopropane (NPB) or other aromatic amine-based organic matter.

The second light extraction layer 108 can not only further improve the light transmittance of the transparent regions of the display panel, but also can improve the light transmittance of the light emitting region and obtain a better display effect.

The present application also provides an electronic device including a display panel as described above, and a light sensor is disposed under the transparent region of the display panel. The light sensor can be a pattern recognition device, a graphics acquisition device, or a distance detection device, such as a camera, a fingerprint recognition unit, or the like.

Figure 6:
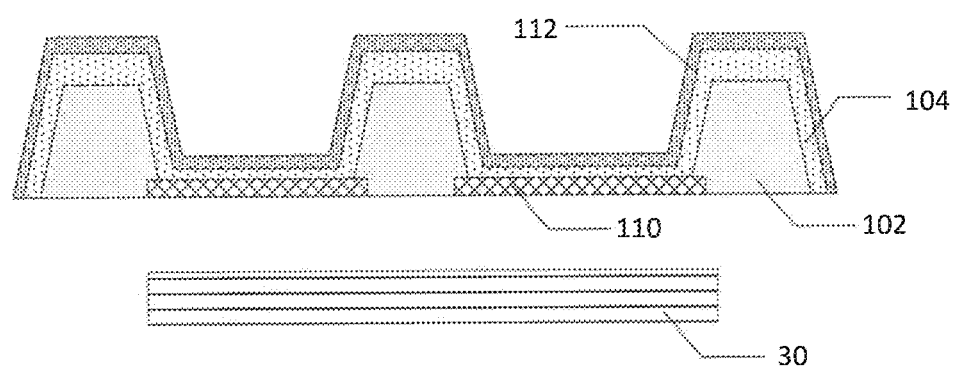
FIG. 6 to FIG. 8 are structural diagram of a display panel integrated with a camera in a third embodiment of the present application.
Figure 7:
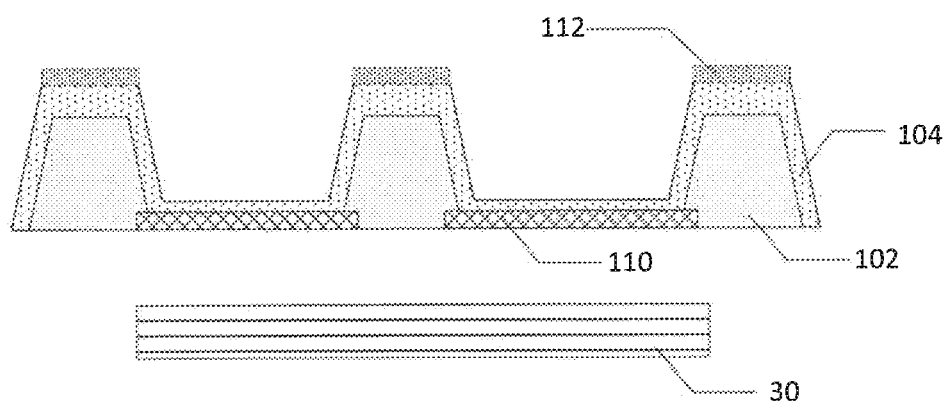

Correspondingly, the present application also provides a method for manufacturing a display panel. Referring to FIG. 6 to FIG. 8, FIG. 6 to FIG. 8 are structural diagrams of a display panel integrated with a camera in the first embodiment of the present application. Wherein the method includes the following steps.

First, referring to FIG. 6, providing a substrate. Then forming a thin film transistor layer on the substrate, the thin film transistor layer includes a thin film transistor unit and a transparent unit, and the photosensor array 30 is integrated in the thin film transistor layer. Then forming a pixel defining layer on the thin film transistor layer 102, the pixel defining layer 102 is provided with through holes. Then forming an anode 110 at a bottom of the through holes and forming a light emitting layer covering the pixel defining layer and the anode.

Thereafter, as shown in FIG. 7, a first light extraction layer 112 covering the light emitting layer 104 is formed, and the first light extraction layer 112 is patterned to cover only the light emitting layer 104 located at the top of the pixel defining layer 102. Specifically, the method for forming the first light extraction layer 112 above the top of the pixel definition layer 102 includes: depositing a transparent protective material on the surface of the cathode 104; removing the transparent protective material on the sidewalls of the anode 110 and the pixel defining layer 102 and retaining the transparent material on the top of the pixel defining layer 102 to form the first light extraction layer 112.

Thereafter, as shown in FIG. 8, forming a cathode 106 covering the light emitting layer 104 and the first light extraction layer 112, and forming a second light extraction layer 108 covering the cathode 106.

Of course, in another embodiment of the present application, the first light extraction layer 112 is located between the cathode 106 and the second light extraction layer 108. That is, the first light extraction layer 102 is formed after the cathode 106 is formed. The location of the first light extraction layer 102 is not to be construed as limiting the present application, and those skilled in the art can select a suitable location of the first light extraction layer 102 as needed.

Referring to FIG. 2 and FIG. 3, FIG. 2 and FIG. 3 are schematic diagrams showing the structure of a display panel integrated with a camera in another embodiment of the present application. In another embodiment of the present application, a method of forming a first light extraction layer 112 over the top of the pixel definition layer 102 includes the following steps.

Forming a through hole in a region above the top of the pixel defining layer 102, a depth of the through hole is less than or equal to a sum of thicknesses of the light emitting layer 104 and the cathode 106. That is, the cathode 106 and the light emitting layer 104 located above the pixel defining layer 102 are removed to expose the top of the pixel defining layer 102, as shown in FIG. 2. Thereafter, a transparent protective material is deposited in the through hole to form a first light extraction layer 112, as shown in FIG. 3.

Referring to FIG. 4 and FIG. 5, FIG. 4 and FIG. 5 are schematic diagrams showing the structure of a display panel integrated with a camera in another embodiment of the present application. In another embodiment of the present application, a method of forming a first light extraction layer 112 over the top of the pixel definition layer 102 includes the following steps.

Forming a through hole in a region above the top of the pixel defining layer 102, a depth of the through hole is less than or equal to a thickness of the light emitting layer 104. That is, the cathode 106 located above the pixel defining layer 102 is removed to expose the top of the pixel defining layer 102, as shown in FIG. 4. Thereafter, a transparent protective material is deposited in the through hole to form a first light extraction layer 112, as shown in FIG. 5.

Retaining the light emitting layer 104 and the cathode layer 106 in the transparent regions 20 can save process steps of removing the light emitting layer 104 and the electrode layer 106 by photolithography, thereby saving cost. Removing the light emitting layer 104 and the electrode layer 106 can further optimize the light transmittance of the display panel. In practice, a suitable structure can be selected by the need for light transmittance.

By removing an electrode layer and a light emitting layer in the transparent region in the light emitting structure in the display panel, the present application avoids light entering the display panel and being absorbed by the electrode layer and the light emitting layer, thereby avoiding light loss and improving light transmittance of the display panel. In addition, the present application also provides a first light extraction layer in the transparent region. The first light extraction layer is made of inorganic or organic small molecules, which can change the optical structure of the device and adjust its microcavity effect, thereby improving the light extraction efficiency of the light transmission region.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A display panel, wherein the display panel is a laminated structure comprising a substrate, a thin film transistor layer on the substrate, a pixel defining layer on the thin film transistor layer, and a light emitting structure on the pixel defining layer;
   wherein the light emitting structure comprises a plurality of transparent regions and a plurality of light emitting regions disposed at intervals, and the transparent regions correspond to light sensors;
   wherein the light emitting structure further comprises a cathode, at least a portion of the cathode is located in the transparent regions; and
   wherein the light emitting structure comprises a first light extraction layer and a second light extraction layer disposed in the transparent region, the first light extraction layer is disposed on a side of the cathode close to the substrate, and the second light extraction layer is disposed on a side of the cathode away from the substrate and covers the first light extraction layer and the cathode.

2. The display panel according to claim 1, wherein the thin film transistor layer comprises a plurality of transparent units corresponding to the plurality of the transparent regions, an area of a projection of the first light extraction layer on a horizontal plane is greater than or equal to an area of a projection of the transparent units in the thin film transistor layer on the horizontal plane.

3. The display panel according to claim 1, wherein the material forming the first light extraction layer is an inorganic substance or organic small molecules.

4. The display panel according to claim 1, wherein a material forming the second light extraction layer is an inorganic substance or organic small molecules.

5. The display panel according to claim 1, wherein an auxiliary light emitting layer is disposed between the pixel defining layer of the transparent regions and the first light extraction layer, the auxiliary light emitting layer consists of an extension of an auxiliary light emitting layer in the light emitting regions adjacent to the transparent regions.

6. The display panel according to claim 1, wherein the cathode is disposed in the transparent regions and the light emitting regions.

7. An electronic device comprising a display panel and a light sensor, wherein the display panel is a laminated structure comprising a substrate, a thin film transistor layer on the substrate, a pixel defining layer on the thin film transistor layer, and a light emitting structure on the pixel defining layer;
   wherein the light emitting structure comprises a plurality of transparent regions and a plurality of light emitting regions disposed at intervals, and the transparent regions correspond to light sensors;
   wherein the light emitting structure further comprises a cathode, at least a portion of the cathode is located in the transparent regions; and
   wherein the light emitting structure comprises a first light extraction layer and a second light extraction layer disposed in the transparent region, the first light extraction layer is disposed on a side of the cathode close to the substrate, and the second light extraction layer is disposed on a side of the cathode away from the substrate and covers the first light extraction layer and the cathode.

8. The electronic device of claim 7, wherein the light sensor is disposed on a side of the substrate away from the thin film transistor layer, and the light sensor is a camera.

9. A method of fabricating a display panel, wherein the method comprises the steps of:
- providing a substrate;
- forming a thin film transistor layer on the substrate;
- forming a pixel defining layer on the thin film transistor layer, the pixel defining layer is provided with through holes;
- forming an anode at a bottom of the through holes;
- forming a light emitting layer covering the pixel defining layer and the anode;
- forming a cathode covering the light emitting layer;
- forming a first light extraction layer on a top of the pixel definition layer; and
- forming a second light extraction layer covering the first light extraction layer and the cathode.

10. The method of fabricating a display panel according to claim 9, wherein a method of forming a first light extraction layer a on a top of the pixel definition layer comprises:
- forming through holes in a region above a top of the pixel defining layer, a depth of the through holes is less than or equal to a sum of a thicknesses of the light emitting layer and the cathode layer;
- forming a first light extraction layer by depositing transparent protective material in the through holes.

11. The method of fabricating a display panel according to claim 9, wherein a method of forming a first light extraction layer on a top of the pixel definition layer comprises:
- depositing a transparent protective material on a surface of the cathode;
- removing the transparent protective material on the anode and sidewalls of the pixel defining layer and retaining the transparent material on the top of the pixel defining layer to form a first light extraction layer.

* * * * *